(12) United States Patent
Straznicky et al.

(10) Patent No.: US 8,941,234 B2
(45) Date of Patent: Jan. 27, 2015

(54) MANUFACTURING PROCESS AND HEAT DISSIPATING DEVICE FOR FORMING INTERFACE FOR ELECTRONIC COMPONENT

(71) Applicant: DY 4 Systems, Inc., Kanata, Ontario (CA)

(72) Inventors: Ivan Straznicky, Carleton Place (CA); Peter Robert Lawrence Kaiser, Kinburn (CA); Steven Drennan, Ottawa (CA); Marc-Jason Renaud, Gatineau (CA); Georges Francis Marquis, Almonte (CA)

(73) Assignee: DY 4 Systems, Inc., Kanata (CA)

( * ) Notice: Subject to any disclaimer, the term of this patent is extended or adjusted under 35 U.S.C. 154(b) by 0 days.

(21) Appl. No.: 14/242,274

(22) Filed: Apr. 1, 2014

(65) Prior Publication Data

US 2014/0209284 A1    Jul. 31, 2014

Related U.S. Application Data

(62) Division of application No. 13/212,494, filed on Aug. 18, 2011, now Pat. No. 8,728,872.

(51) Int. Cl.
*H01L 23/34* (2006.01)
*H01L 23/36* (2006.01)
(Continued)

(52) U.S. Cl.
CPC .............. *H01L 23/373* (2013.01); *H01L 23/36* (2013.01); *H01L 23/42* (2013.01); *H01L 24/27* (2013.01);
(Continued)

(58) Field of Classification Search
CPC ......... H01L 23/28; H01L 23/34; H01L 23/36; H01L 23/3675; H01L 23/42; H01L 2223/54486; H01L 2224/83024; H01L 2224/8321; H01L 2224/83815; H01L 2924/1532

See application file for complete search history.

(56) References Cited

U.S. PATENT DOCUMENTS 6,833,289 B2   12/2004   Hu et al.
7,347,354 B2   3/2008    Hurley et al.
(Continued)

OTHER PUBLICATIONS

Yuquan, Li., Johnson, R.W., Thompson, P., Hooghan, T., & Libres, J.; "Reliability of Flip Chip Package with High Thermal Conductivity Heat Spreader Attach." 2008 Electronic Components and Technology Conference (ECTC); Lake Buena Vista, FL; IEEE (2008).
(Continued)

*Primary Examiner* — Zandra Smith
*Assistant Examiner* — Pamela E Perkins
(74) *Attorney, Agent, or Firm* — Pearne & Gordon LLP

(57) ABSTRACT

A method includes preparing a bonding surface of a heat dissipating member, applying flux to the bonding surface of the heat dissipating member, and removing excess flux from the bonding surface so that minimal flux is provided. The method also includes preparing a die surface of an electronic device package, applying flux to the die surface, and removing excess flux from the die surface so that minimal flux is provided. The method further includes positioning a preform solder component on the die surface, positioning the heat dissipating member over the die surface and the preform solder component such that the flux layer of the bonding surface is in contact with the preform solder component, and reflowing the solder component using a reflow oven. A heat spreader is also described for use in the process.

13 Claims, 8 Drawing Sheets

(51) Int. Cl.
*H01L 23/373* (2006.01)
*H01L 23/42* (2006.01)
*H01L 23/00* (2006.01)

(52) U.S. Cl.
CPC ............... *H01L 24/29* (2013.01); *H01L 24/83* (2013.01); *H01L 2224/83208* (2013.01); *H01L 2224/27334* (2013.01); *H01L 24/32* (2013.01); *H01L 2224/29109* (2013.01); *H01L 2224/83024* (2013.01); *H01L 2224/8314* (2013.01); *H01L 2224/83191* (2013.01); *H01L 2224/8321* (2013.01); *H01L 2224/83815* (2013.01); *H01L 2924/10253* (2013.01); *H01L 2224/32245* (2013.01)
USPC ........... 257/720; 257/675; 257/707; 257/717; 257/E23.051; 257/E23.101

(56) References Cited

U.S. PATENT DOCUMENTS

| | | | |
|---|---|---|---|
| 7,629,203 B2 | 12/2009 | Suh et al. | |
| 7,955,900 B2 | 6/2011 | Jadhav et al. | |
| 2004/0262372 A1 | 12/2004 | Houle et al. | |
| 2005/0211752 A1* | 9/2005 | Hurley et al. | 228/245 |
| 2005/0280142 A1 | 12/2005 | Hua et al. | |
| 2007/0013054 A1 | 1/2007 | Ruchert et al. | |
| 2007/0051774 A1* | 3/2007 | Stipp et al. | 228/101 |
| 2007/0273009 A1 | 11/2007 | Hauenstein et al. | |
| 2007/0287005 A1 | 12/2007 | Jayaraman et al. | |
| 2008/0239660 A1* | 10/2008 | Mustapha et al. | 361/688 |
| 2008/0277771 A1 | 11/2008 | Higashi et al. | |
| 2010/0044856 A1* | 2/2010 | Sri-Jayantha et al. | 257/717 |
| 2012/0305632 A1 | 12/2012 | Ross et al. | |
| 2013/0270691 A1* | 10/2013 | Mallik et al. | 257/713 |

OTHER PUBLICATIONS

Hua, F., Deppisch, C., Fitzgerald, T., Indium as Thermal Interface Material for High Power Devices; Advancing Microelectronics Magazine, pp. 16-17 (Jul./Aug. 2006).

Search Report from UK Intellectual Property Office dated Dec. 11, 2012 for corresponding application GB1212780.9.

* cited by examiner

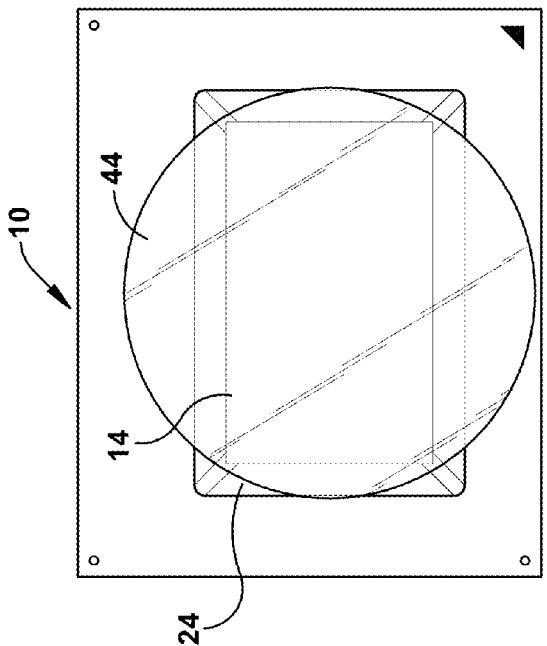
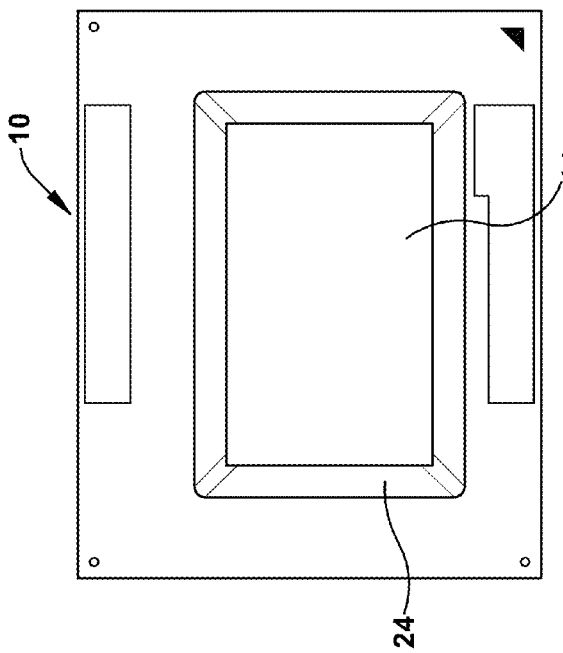
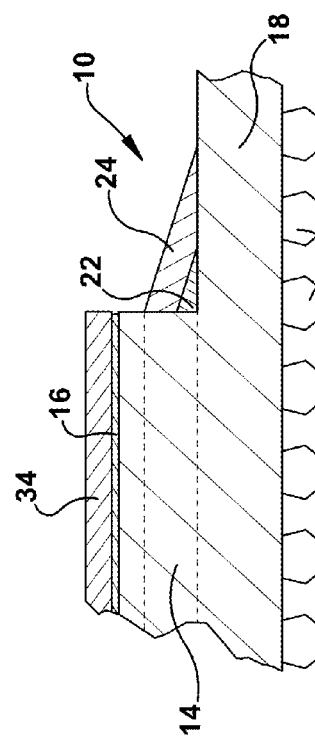

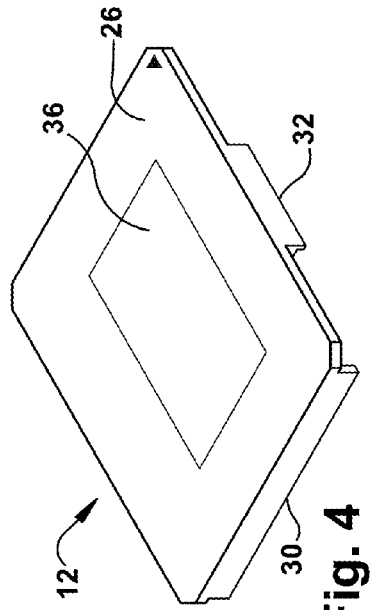
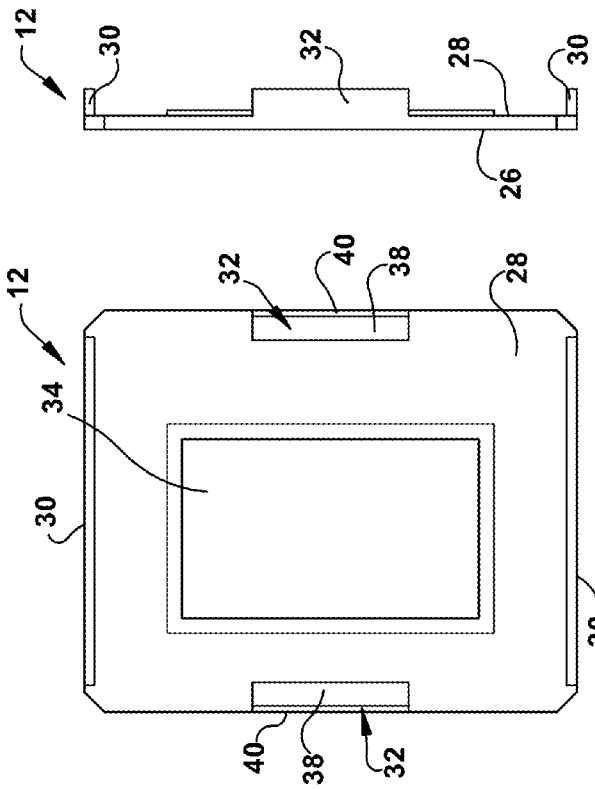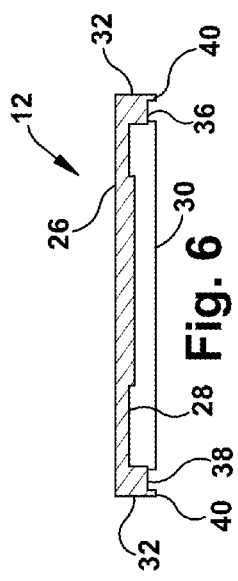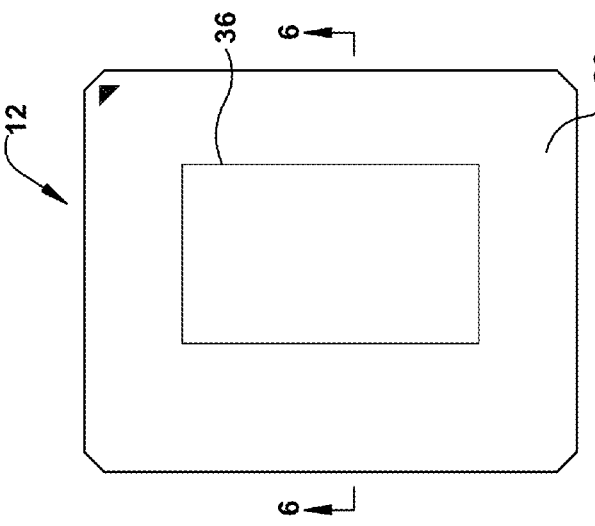

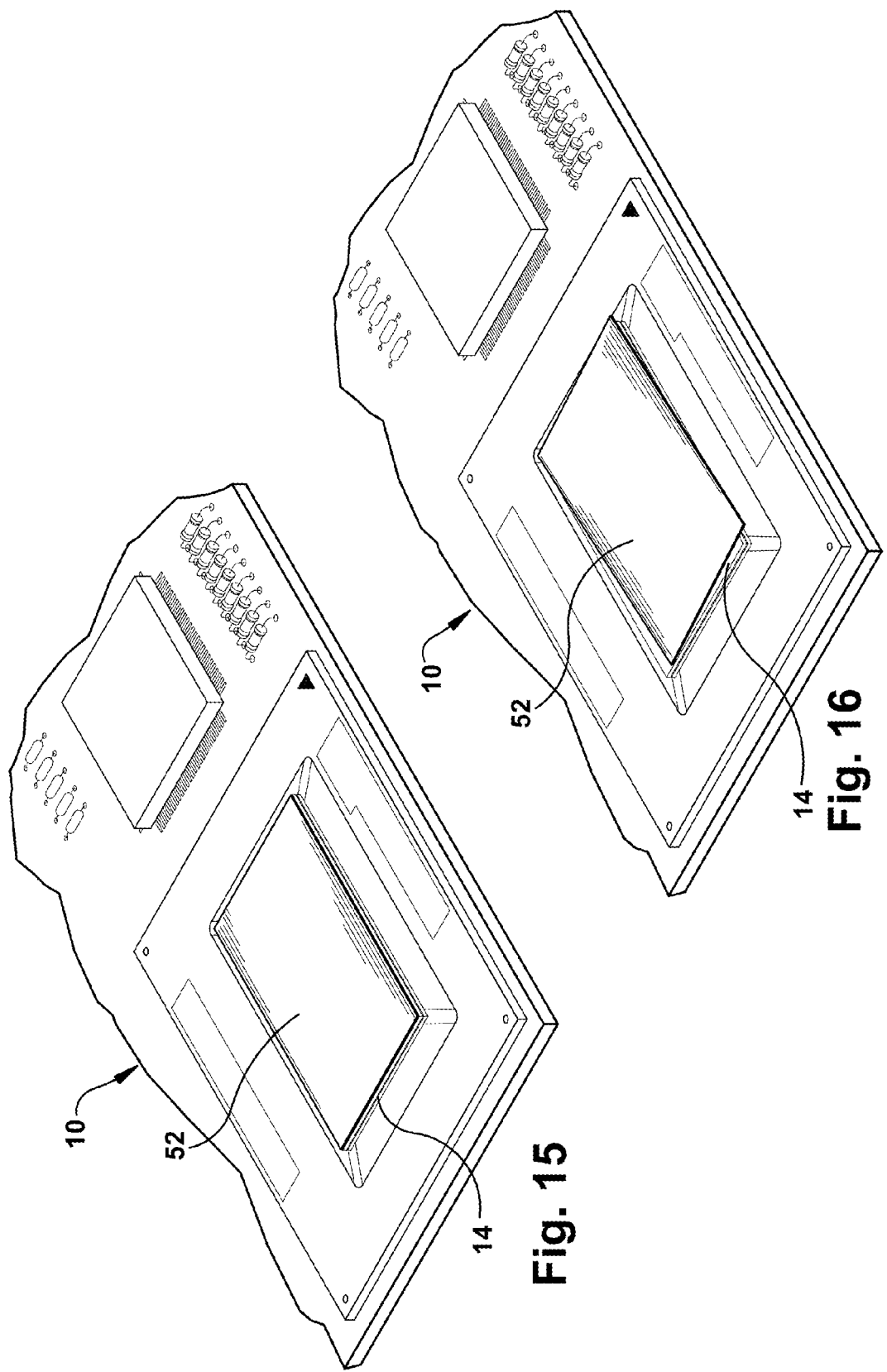

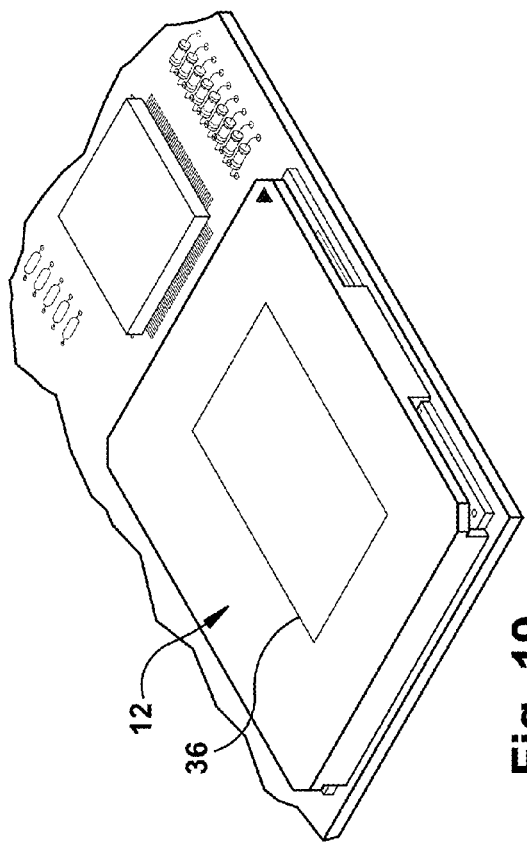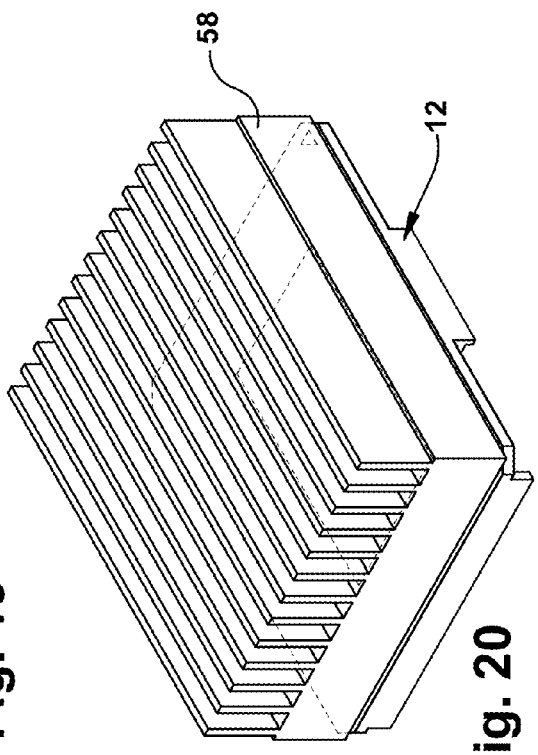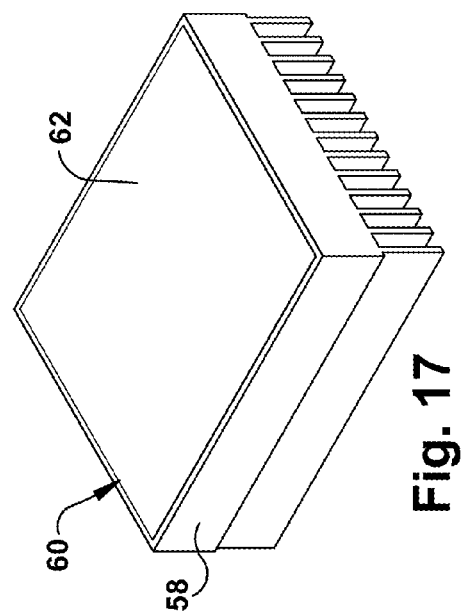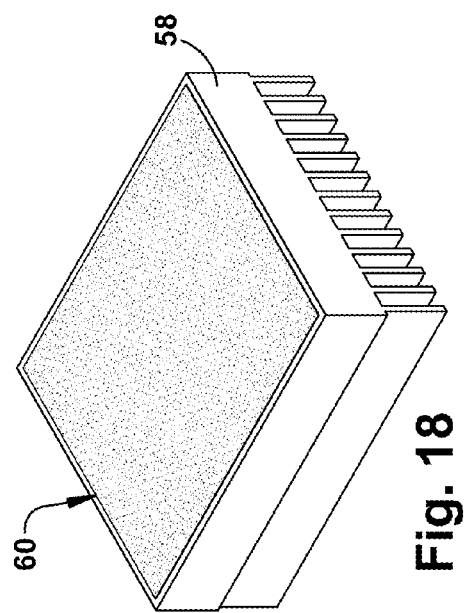

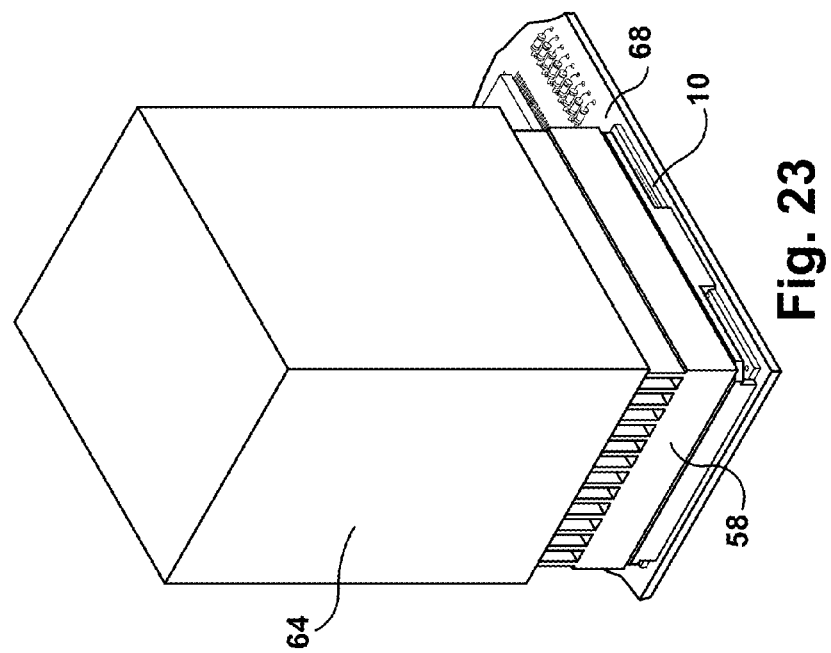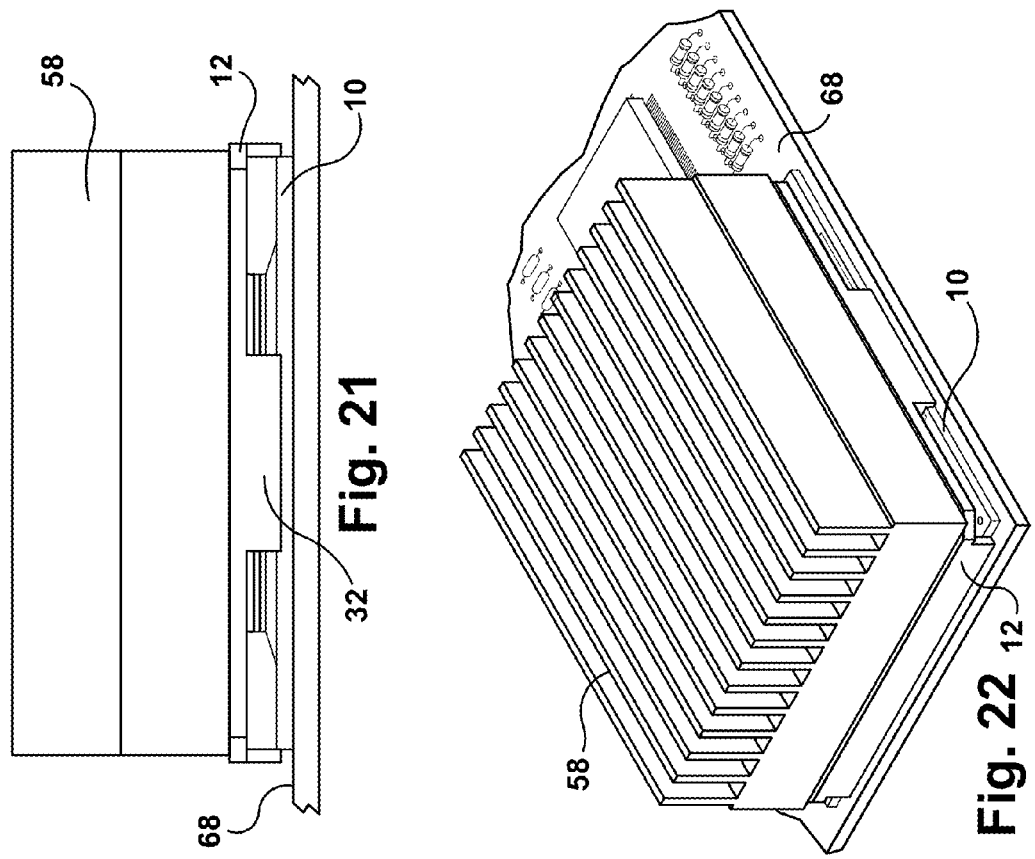

MANUFACTURING PROCESS AND HEAT DISSIPATING DEVICE FOR FORMING INTERFACE FOR ELECTRONIC COMPONENT

CROSS-REFERENCE TO RELATED APPLICATIONS

This is a divisional application of application Ser. No. 13/212,494, filed Aug. 18, 2011, the entire disclosure of which is hereby incorporated by reference.

FIELD

The technology described herein relates to a manufacturing process for applying a solder thermal interface material for use in high heat electronic devices. The technology described herein also relates to a new and useful heat spreader.

BACKGROUND

Semiconductor circuit processing has seen dramatic improvements that allow semiconductor manufacturers to shrink the size of circuits formed on wafers. This shrinkage provides a cost advantage to the manufacturer because more circuits can be provided in a given area of a wafer surface. Semiconductor circuits generate a lot of heat caused by resistance to electricity running through the circuits. As density increases, the amount of heat generated also increases. Heat build up can impact the performance, reliability, and durability of electrical components. Thus, an efficient heat removal system is necessary.

Heat dissipating devices, such as heat spreaders, have been used to dissipate heat from electronic components. These devices draw heat away from the electronic components and spread it over a larger area for further heat removal. Surface contact between the heat dissipating devices and the electronic components is a factor in determining how efficiently the heat dissipating devices operate. Thermal conductivity between surfaces is related to the surface area that is in direct contact. Because surfaces of heat spreaders and electronic components are not perfectly flat or smooth, it is difficult to achieve perfect contact between surfaces. Because air is a poor thermal conductor, any air pockets between the surfaces can inhibit heat dissipation. To overcome this problem, thermal interface materials have been used to fill gaps between surfaces.

A variety of materials have been used as thermal interface materials, including phase change materials and metallic solder. The use of metallic solder can result in improved conductivity, but processes for their application to component surfaces have their drawbacks. Achieving a durable bond in the soldering process may involve reflow of the thermal interface materials. In addition, heating temperatures necessary to appropriately heat the solder may damage the electronic components.

Prior implementations of solder thermal interface materials (STIMs) used fluxless soldering in a vacuum oven in order to minimize voids in the STIM. One type of material that has been used in these fluxless soldering operations is Indium. Specialized equipment and knowledge was required in this process. Prior implementations also required the metallization of a silicon die at the die level. This required that the component manufacturer perform the operation. In addition, many prior implementations required STIM soldering prior to or coincident with mass assembly reflow. These prior methods often resulted in an impermanent bond between the STIM and the electronic component, which was undesirable. Fluxless bonding methods are known to have low throughput and involve high costs, which can make them unsuitable for high volume semiconductor manufacturing. Other prior implementations involved the use of flux, but the flux was known to cause voids, which resulted in reliability issues.

SUMMARY

In accordance with the teachings described herein, a method comprises preparing at least two bonding surfaces on one or more of a lower surface of the heat dissipating member, a die surface, or a lower or an upper surface of a preform solder component, preparing a mating surface on one or more of the lower surface of the heat dissipating member, the die surface, or the lower or the upper surface of the preform solder component, and applying flux to the bonding surfaces. The method also includes removing excess flux from the bonding surfaces so that minimal flux is provided, positioning the preform solder component on the die surface, positioning the heat dissipating member over the die surface and the preform solder component; and reflowing the solder component using a reflow oven. The flux layers on the bonding surfaces are positioned between both the preform solder component and the die surface and the preform solder component and the heat dissipating member.

The bonding surfaces may be the die surface and the lower surface of the heat dissipating member. Alternatively, the bonding surfaces may be the die surface and the upper surface of the preform solder component. The bonding surfaces may be the lower surface of the preform solder component and the upper surface of the preform solder component, or the bonding surfaces may be the lower surface of the preform solder component and the lower surface of the heat dissipating member.

The method may further include aligning tabs that are positioned on the heat dissipating member with the electronic device package in order to properly position the heat dissipating member on the electronic device package. Standoffs may be positioned on the heat dissipating member that extend from a lower surface of the heat dissipating member and have a height that promotes squeeze out of the preform solder component when the heat dissipating member is positioned over the electronic device package.

The electronic device package may be a BGA package and the method may also include providing a die component and metalizing the die component at the BGA package level, including cleaning and masking the BGA package and metalizing any exposed die surfaces. Metalizing may include applying at least one layer of gold. The method also includes assembling the BGA package onto a circuit card prior to preparing the die surface of the BGA package, and checking the metallization adhesion to the die.

The electronic device package may be a BGA package assembled on a circuit card assembly, and the method may also include providing a die component and metalizing the die component at the circuit card assembly level, including cleaning and masking the circuit card assembly and metalizing any exposed die surfaces. The metalizing step may include applying at least one layer of gold. The metalizing step may include applying a first layer of titanium followed by a second layer of gold. Prior to metallization, the method may include cleaning the exposed silicon die and BGA package with an etching process. The etching process may utilize argon (Ar) plasma.

The flux utilized in the process may be a diluted flux. The method may include removing excess flux by absorbing any excess flux with an absorbent medium.

The method may also include applying a heatsink weight to the heat spreader. The heatsink weight may be positioned on top of the heat spreader during reflow in order to promote squeeze-out of solder of the preform solder component and for even temperature distribution over the preform solder component. The method may also include applying a second weight to the heatsink weight and removing the second weight prior to reflow heating. Reflow heating may occur in a standard reflow oven. The maximum temperature of heating in the reflow oven may be such that the electronic component assembly's temperature is lower than about 20 degrees C. below the melting point of the electronic component assembly solder.

In another aspect of the invention, A heat spreader includes a body having a substantially flat upper surface and a substantially flat lower surface, gold plating in at least an area on the lower surface of the body that is for aligning with a die and a solder component of an electronic device package, and standoffs extending from the lower surface of the body and having a height that promotes squeeze-out of a solder thermal interface material when the heat spreader is positioned over an electronic device package.

The standoffs are support surfaces that mate with an edge of an electronic device package. The heat spreader may be nickel plated on at least part of its external surface and may have a width and a length that is greater than a width and a length of an electronic device package.

The heat spreader may include alignment tabs for aligning the heat spreader with the outside edges of an electronic device package. The alignment tabs may be defined to substantially abut the edges of the electronic device package. The heat spreader may be etched on an upper surface of the body that coincides with the location of a die when the heat spreader is positioned over a die on an electronic device package. The heat spreader may have low surface roughness in the area of the gold plating.

BRIEF DESCRIPTION OF THE DRAWING FIGURES

FIG. 1 is a top view of a die/BGA package utilized in connection with the example method;

FIG. 2 is a cross-sectional side view of the die/BGA package of FIG. 1;

FIG. 3 is a top view of a die/BGA package having a tape dot installed for use with pick and place equipment and/or storage;

FIG. 4 is a perspective top view of an example heat spreader;

FIG. 5 is a top view of the heat spreader of FIG. 4;

FIG. 6 is a cross-sectional side view, taken at line 6-6 in FIG. 5, of the heat spreader of FIG. 4;

FIG. 7 is a bottom view of the example heat spreader of FIG. 4;

FIG. 8 is a side view of the example heat spreader of FIG. 4;

FIG. 15 depicts properly aligned solder preforms positioned on the die surface;

FIG. 16 depicts improperly aligned solder preforms positioned on the die surface;

FIG. 17 depicts a bottom surface of a weight that is for application to an example heat spreader, with the weight incorporating an adhesive strip with a backing in place;

FIG. 18 depicts the bottom surface of the weight with the backing of the adhesive strip removed;

FIG. 19 depicts the top surface of the heat spreader showing the die pattern engraved on the top surface thereof for assistance in placing the heat spreader on a die;

FIG. 20 depicts a first finned weight applied to the top surface of the heat spreader;

FIG. 21 depicts a side view of the heat spreader and weight being positioned on a die/BGA package;

FIG. 22 depicts a perspective top view of a heat spreader and finned heatsink weight positioned on a die/BGA package;

FIG. 23 depicts the positioning of a weight block on the heat spreader and the heatsink weight depicted in FIG. 22;

DETAILED DESCRIPTION

Figure 10:
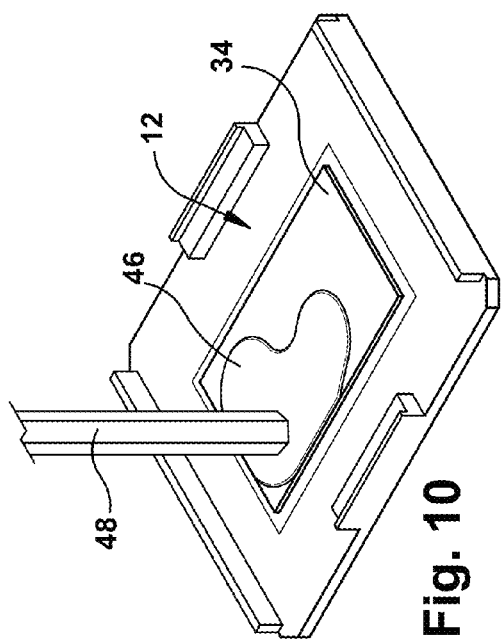
FIG. 10 is a view of flux being applied to the lower surface of the example heat spreader with the applicator.

The technology described herein relates generally to a manufacturing method and heat spreader design for coupling a heat spreader to an electronic component, such as a die, using a solder thermal interface material (STIM). The solder thermal interface material is implemented for high heat electronic devices to significantly reduce operating temperatures of the die and associated electronic device package. The disclosure herein provides a process for permanently attaching a metallic solder layer to a bonding surface of a heat dissipating device and to a surface of a die.

Increasing heat dissipation and density of components requires the continued exploration of new materials for cooling. Indium is utilized herein as a material to use as a solder for the thermal interface material. Indium has a thermal conductivity that is much greater than previously used thermal interface materials. For example, indium has a thermal conductivity of about k=86 W/m °K while phase change material may have a thermal conductivity in the range of about k=1-10 W/m °K. Indium has a significantly lower thermal resistance and a higher thermal conductivity than prior thermal interface materials. The example process uses minimal flux to reduce voids, which allows the use of a standard reflow oven and standard reflow knowledge. The process provides significant thermal performance benefits. The example method described herein involves the reflow soldering of a STIM between a metalized die on a ball grid array (BGA) package along with a custom designed heat spreader in order to significantly decrease semiconductor junction temperatures and allow higher performance at a given ambient temperature.

An electronic device package 10, such as a die/BGA package, for use with the example process and example heat spreader 12, is shown in FIGS. 1 and 2. A die 14 is positioned on a BGA substrate 18 to form the electronic device package 10, also referred to herein as die/BGA package or BGA package. When the terms die/BGA package or BGA package are utilized herein, it should be understood that any type of electronic device package is intended, not limited to a BGA substrate. The BGA substrate 18 includes solder balls 20 for mounting with a printed circuit board. The die 14 is surrounded by underfill 22. While a single die is shown, it should be noted that multiple dies on a single package may also derive significant benefit from the invention.

FIGS. 4-7 depict an example heat spreader 12 that has a top surface 26, a bottom surface 28, alignment tabs 30 and standoffs 32. Standoffs 32 incorporate support surfaces 38 and outer legs 40. The top and bottom surfaces 26, 28 of the heat spreader 12 are substantially flat and are not warped. The bottom surface 28 includes a gold metalized pad 34 that coincides with the location of the underlying die surface 14 when the package 10 is assembled. The top surface 26 includes an etched or engraved pattern 36 which depicts where the underlying metalized gold pad 34 is located. The alignment tabs 30 are located along the top and bottom edges of the bottom surface 28 of the heat spreader 12 and extend downwardly therefrom. The standoffs 32 are positioned along the sides of the heat spreader 12 and have a support surface 38 that is designed for abutting an upper surface of the electronic device package 10. The outer legs 40 of the standoffs 32 are designed to extend along and abut the outer edge of the underlying electronic device package 10. The alignment tabs 30 are also designed to extend along and abut the outer edges of the electronic device package 10. The heat spreader 12 has dimensions that are greater than the dimensions of the electronic device package 10 so that the heat spreader 12 may fit over the electronic device package 10.

In one example, the heat spreader is nickel plated on all or part of its external surfaces and a layer of gold is applied to all external surfaces. Alternatively, the heat spreader may be nickel plated on all or part of its external surfaces, with a layer of gold only positioned on the bottom surface of the heat spreader. Alternatively, the heat spreader may be nickel plated on all or part of its surfaces and have a gold layer positioned only in the area where the heat spreader contacts the die. Other coating combinations may be utilized. Other types of coating materials may also be found to be useful.

The example process begins with the provision of a die on a substrate 18 by an electronic component manufacturer. Once the die is provided, the die can be metalized at the BGA package level. An example of a die is shown in FIGS. 1-2, which depicts a BGA package 10 having a single silicon die 14. As discussed above, multiple dies of the same or different sizes may be positioned on a single package 10.

The surface of the die 14 is prepared and inspected before further work is performed. The top surface of the die is checked for any surface irregularities or defects that may be detrimental to metallization operations. Defects are determined by examining the die surface under magnification.

If any defects are detected in a die 14, the surface of the die 14 is cleaned with acetone and a lint free swab and then reinspected. If surface defects are detected that are deemed detrimental for metallization, the die 14 is not utilized. Once the surface is deemed acceptable, the surface of the die 14 is prepared using an argon oxygen plasma etch process to further remove any foreign contamination that may be present and that could lead to coating defects. For example, the Argon etching may occur at 200 W, 50 mT, 30 SCCM 02 and 8 SCCM of AR for 120 seconds. Other etching processes may alternatively be used.

The example process involves metalizing the silicon die 14 at the ball grid array (BGA) package level, which requires cleaning and masking of the entire BGA package 10. This allows for the metallization and STIM soldering of any exposed die 14 part, not just the electronic components that the component manufacturer may provide as metalized. This approach also allows for metallization and STIM soldering of modules such as graphics cards, among other modules.

After cleaning, all areas around the die 14 are masked or protected from any metal deposition such that only the desired parts of the BGA package 10 are exposed. Precautions are also taken to avoid damaging the silicon die 14, the die underfill 22 or any other areas of the package 10. Minimal vertical pressure is applied to the substrate during the masking process so as not to deform the solder balls of the BGA package 10.

The silicon die 14 may then be metalized, an example of which is shown best in FIG. 2. The die 14 is first coated with a layer of titanium (Ti) 16, which is followed by a layer of gold (Au). The layer of gold (Au) is the uppermost surface of the die 14.

One composition for the metallization layers for the titanium base layer 16 may have a thickness of about 1000 A+−25 A. One composition for the gold layer may have a thickness of about 5000 A+/−50 A. Other compositions may be used if desired. Gold (Au) on Nickel (Ni) on titanium (Ti) may alternatively be utilized. Other metallization compounds may alternatively be used.

The surface of the die 14 is then inspected for scratches and chips. Die 14 should not be used if it exhibits large edge chips, such as those with a size of 0.015×0.30 inches or larger. The die 14 is wiped clean with a control wipe that is lint free and may be dipped in isopropyl alcohol. The alcohol should be allowed to evaporate. The component substrate should also be checked to confirm that it is not warped.

Once all metal deposition layers have been completed, it is desirable to perform an adhesion test using a semi-conductive tape with a silicone adhesive in accordance with ASTM-D3359-09 Test Method "A" (without scribing the surface). An acceptable tape that may be used is McMaster Carr #7649A91. Other tapes may alternatively be used. Acceptable criteria for the metal deposit layers are no peeling or removal.

A Kapton (polyimide) pad (tape dot) 44, such as shown in FIG. 3, may be positioned on the metalized die surfaces. The tape dot 44 serves as a pick up location for the vacuum nozzle of pick and place equipment. The pad 44 may be 5 mil thick and have a silicone adhesive backing and be either 1" round or 1" square, the size being dependent upon the size of the die 14. The tape dot 44 also provides a conformance check for metallization adhesion to the silicon.

After metal deposition, all loose metal flakes from the deposition process that are present anywhere on the device are removed using a lint-free swab and acetone, or the like. Special attention is given to the fillet of underfill 22 around the perimeter of each die 14. The acetone swab is gently rubbed back and forth on the underfill 22 to remove any loose metal. If the metal is still well adhered, this is considered acceptable.

The electronic device package 10 is then assembled, via pick and place, onto its circuit card using standard processes, such as mass assembly reflow. After mass assembly reflow, the tape dot 44 is removed to check for metallization adhesion to the silicon.

After the electronic device package 10 has been assembled to the PCB 68, the heat spreader 12 is used in the second stage of the process and the assembly is manually assembled. The heat spreader 12 is a machined metal plate that is used for transferring heat. It may be copper that is nickel plated, with gold interface pads 34. Other materials and coatings may alternatively be utilized.

The heat spreader 12, which may be custom-designed, has features that assist in STIM soldering. The heat spreader 12 may be nickel plated for corrosion protection and to provide a soldering surface for the STIM. Other materials/coatings may alternatively be utilized, if desired. The heat spreader 12 may be gold plated in the area to be soldered to improve wetting of the STIM during reflow. Alternatively, the entire bottom surface of the heat spreader or the entire exterior surface of the heat spreader may be gold-plated. The heat spreader 12 has low surface roughness in the area to be soldered.

As discussed above, the heat spreader 12 includes standoffs and positioning features. The heat spreader standoffs 32 have a height setting feature 38 that promotes slight squeeze out of the STIM when melted. The standoffs 32 are sized and located to minimize the effect of BGA package warpage, which could otherwise result in no squeeze out or the creation of too large a gap between the die 14 and the heat spreader 12, leading to insufficient solder coverage. The containment or alignment features 30 and 40 help to keep the heat spreader 12 aligned over the electronic device package 10 during STIM melting.

The heat spreader 12 may be checked for burrs along the edges of its surfaces to ensure that no damage has occurred to the gold interface surfaces 34. The heat spreader 12 may also be inspected to confirm that the gold covered surfaces are adequately covered. For example, if a surface is missing less than 1% of the gold surface, it is acceptable. The heat spreader 12 can be positioned so that it contacts the electronic device package 10 on two sides and to check for any noticeable warpage of the electronic device package 10 or of the heat spreader 12.

Once the heat spreader 12 sides have been checked, the surfaces of the heat spreader 12 can be cleaned using a lint free wipe wetted with alcohol. The gold surfaces on the heat spreader are wiped to remove any contaminants such as finger oils, leaving no lint. The top edges of the electronic device package 10 should be clean, especially in the areas interfacing with the heat spreader 12. In addition, the die surfaces should be cleaned in a similar manner by wiping with a lint free wipe that is wetted with alcohol to remove any contaminants, such as finger oils, leaving no lint.

Figure 9:
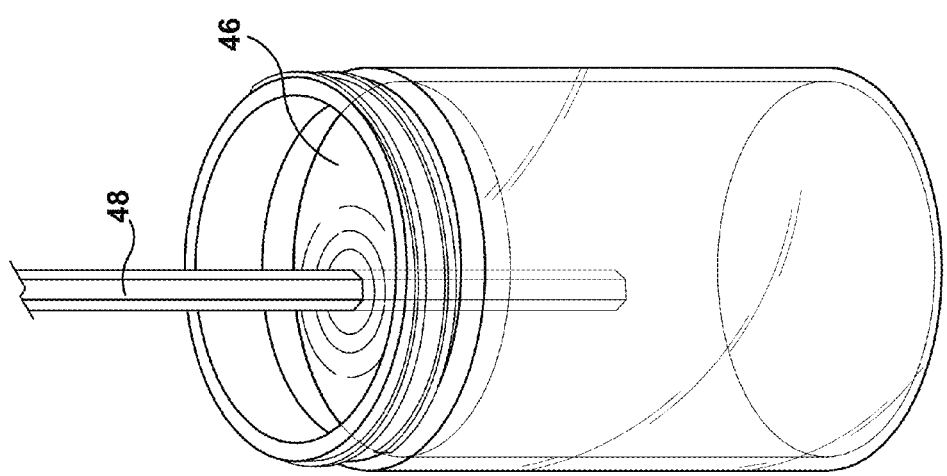
FIG. 9 depicts a jar of flux including a pick applicator for use in applying flux to the example heat spreader and die/BGA package.

The next step in the process is to apply flux 44 to the bonding surface of the die 14 and heat spreader 12. Using a prepared flux mixture 46, shown in FIG. 9, diluted flux is applied to the metalized die bonding surface 14 using a rod 48, shown in FIG. 10 in connection with the heat spreader 12, and excess flux is removed using absorbent media, such as a lint-free tissue in a loop 50 or other media, shown in FIG. 11 for the heat spreader 12, such that minimal flux is present. Any liquid flux should be removed after 10 seconds and within an additional 30 seconds. Minimal flux is enough flux to cover the area in a thin layer and is typically applied in a diluted form. One type of diluted flux has a ratio of 10 parts isopropyl alcohol to 1 part rosin-based flux. Other ratios for diluted flux may also be used, such as 5:1, 20:1 or other variations above, below, or in between. Other types of fluxes may also be used, such as no-clean flux and organic flux, among others.

The tolerance of flux and alcohol measured can be +/−10%. Flux in sufficient quantities is required in order to promote good fusion of the indium solder to the metalized surfaces without creating voids or gas bubbles.

After removal of the liquid flux, only a very thin flux layer and no apparent liquid should be seen. Lint on the die 14 may be removed with a precut wipe in a loop 50. If any pressure is needed, the die 14 and the rest of the component will need to be cleaned off with a full wipe with alcohol and the flux process repeated. If flux is allowed to dry for over a minute, too much will remain for the process and the part will need to be cleaned off with a full wipe with alcohol and the flux process repeated. To avoid issues with increased flux concentration by evaporated alcohol, the flux mixture should be discarded after 35 days.

Figure 11:
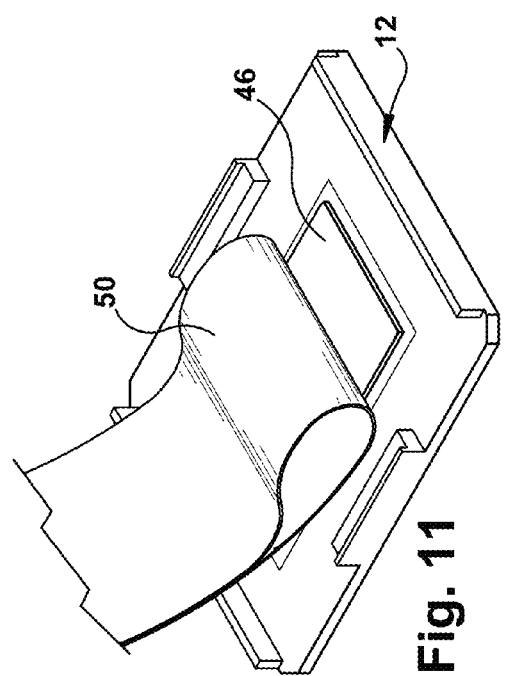
FIG. 11 is a view of a lint free swab being used in a loop to remove excess flux from the example heat spreader lower surface.

Flux is then also applied to the bonding surfaces of the gold areas 34 on the lower surface 28 of the heat spreader 12, as shown in FIG. 10. Flux 46 is spread over the gold plated areas 34 of the heat spreader 12. After 10 seconds and within an additional 30 seconds, the liquid flux is removed using a pre cut control wipe held in a loop 50, as shown in FIG. 11, such that minimal flux remains. After removal of the liquid flux, only a very thin flux layer and no apparent liquid should be seen. If flux 46 is allowed to dry for over a minute, too much will remain for the process and the part will need to be cleaned off with a full wipe with alcohol and the flux process repeated.

Figure 14:
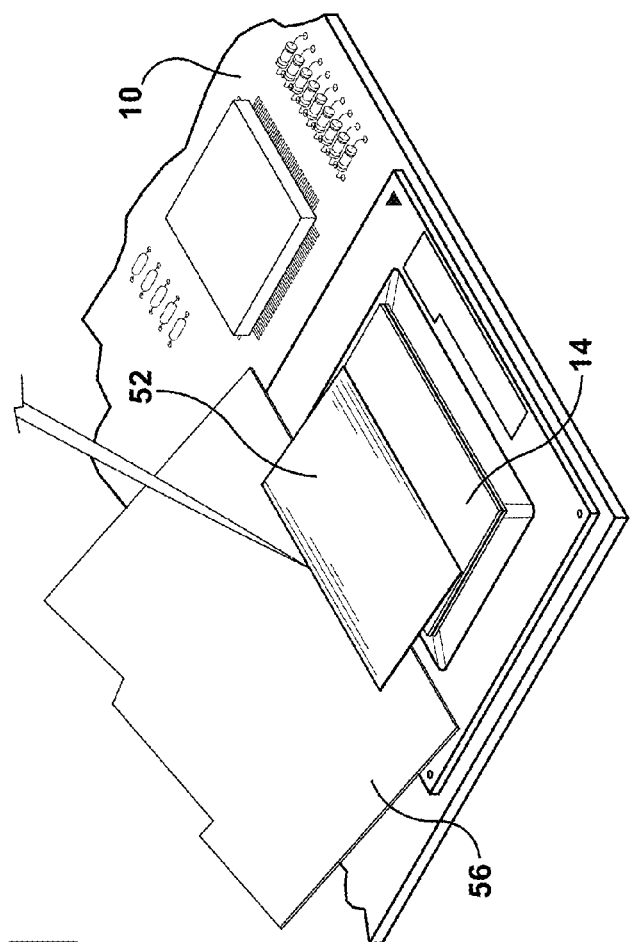
FIG. 14 depicts the spatula being used to position an indium solder preform on the die surface.
Figure 12:
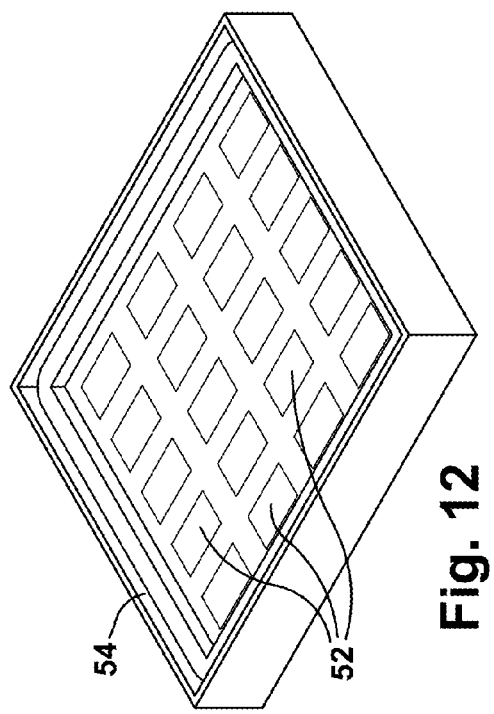
FIG. 12 depicts a plurality of indium solder preforms positioned in a storage box.
Figure 13:
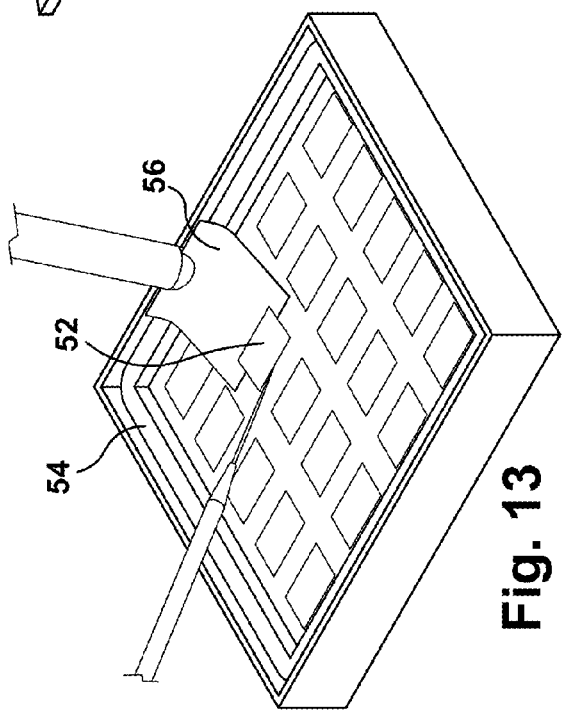
FIG. 13 depicts a spatula for use in moving the indium solder preforms to the die surface.

The next step in the process is to position a solder thermal interface material (STIM) preform on the metalized die 14 surface. The preform is a consistent flat rectangular piece of indium metal that is substantially the same size as the die 14 to which it is being applied. Indium preforms 52 may be provided in a storage case 54, as shown in FIG. 12. The preforms 52 may be picked up with a special spatula 56 that is attached to an x-actor knife blade holder, shown in FIG. 13. The preform 52 is flipped or slid onto the spatula 56. Folding or scratching of the surface of the indium preform 52 should be avoided. Then the indium preform 52 is slid onto the pre-fluxed component die 14, as shown in FIG. 14.

Proper alignment of the preform 52 on the die 14 involves being able to see the edge of the die 14 around the edge of the preform 52. FIG. 15 depicts properly aligned preforms 52 while FIG. 16 depicts improperly aligned preforms 52. If the preform 52 overhangs the die 14 by more than 0.005 inches, placement is not proper. One type of preform 52 that is utilized can be 0.01" thick. Indium preforms 52 are delicate and must be kept clean. Indium preforms 52 typically will melt at 157 degrees C., which is below tin-lead and lead free solder melting temperatures.

The next step in the process involves positioning a heat spreader 12 on the component die 14 and positioning a heatsink weight 58 on the upper surface 26 of the heat spreader 12. The heatsink weight is a first weight that is applied to the upper surface 26 of the heat spreader 12 and acts to improve heat transfer during the reflow process and also acts to promote squeeze-out of the indium preform during reflow. The heatsink weight 58 has a strip of thermal tape 60 that has a backing 62, as shown in FIG. 17. When the backing 62 is removed, as shown in FIG. 18, the heatsink weight 58 may be applied to the top surface 26 of the heat spreader 12. The heatsink weight 58 may be finned, as shown in FIG. 20.

A die 14 outline may be etched or engraved 36 on the top surface 26 of the heat spreader 12 in order to assist in orientation of the heat spreader 12, as shown in FIG. 19. Using this outline, the heat spreader 12 may be oriented over the die 14 so the gold area 34 on the heat spreader 12 is located over the die 14 surface. The heatsink weight 58 is then positioned on the heat spreader 12, which will cover the engraving 36 on the top surface of the heat spreader 12. The double sided thermal tape 60 on the heatsink weight 58 is installed to keep the heatsink weight 58 from moving. Then the heat spreader 12 is lowered onto the component die 14 by aligning the alignment tabs 30 and the outer legs 40 of the heat spreader 12 to fit around the outside edges of the electronic device package 10, as shown in FIGS. 21 and 22. The alignment features 30 and 40 prevent excessive movement of the indium preform 52 on the die 14, particularly since the engraving on the heat spreader is no longer visible.

Once the heat spreader 12 is positioned on the electronic device package 10, a second weight, such as a block weight 64, shown in FIG. 23, may be positioned on top of the heat spreader 12 center to compress the preform 52 to assist in contact between the flux coated surfaces. The block 64 can be removed after 5 seconds. The block may be, for example, a 1.3 kg block. The second weight ensures contact between the indium solder preform, the die, and the heat spreader.

Once the heat spreader 12 and die/BGA package 10 are assembled, the entire assembly is then positioned in a standard reflow oven (not shown). The assembly may be positioned on a conveyor chain, such as on conveyor chain pins. Where a conveyor is not used, the assembly may simply be positioned in an oven. The STIM is melted at temperatures that are less than or equal to the melting point of the electronic component assembly solder minus about 20 degrees. For example, for an assembly solder with a melting point of 200 degrees C., the STIM is melted at about 180 degrees C. or lower. Then the assembly is allowed to cool and the heatsink weight 48 is removed.

Figure 24:
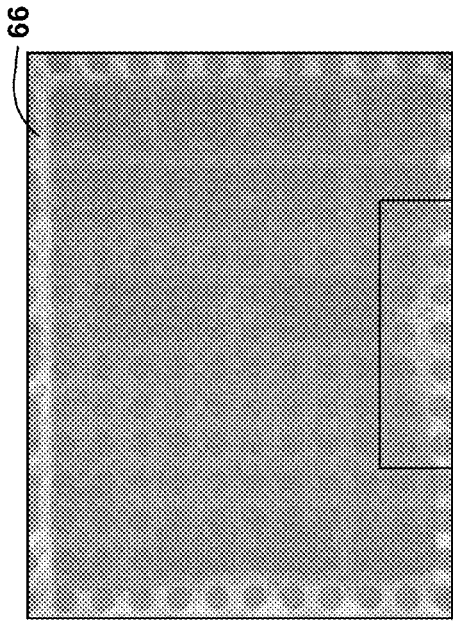
FIG. 24 depicts an x-ray image of an acceptable bond between a heat spreader and a die showing slight solder spill-over.
Figure 26:
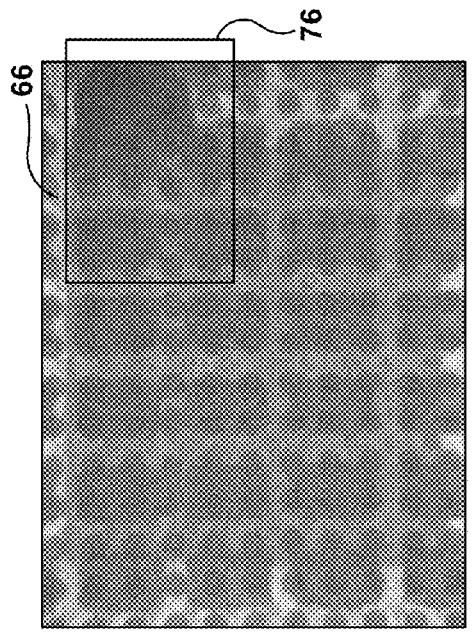
FIG. 26 depicts an x-ray image of an unacceptable bond between a heat spreader and a die showing incomplete die contact and a void in the solder.
Figure 25:
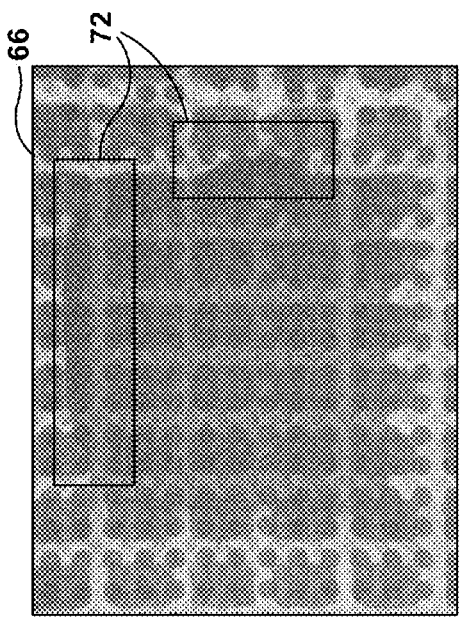
FIG. 25 depicts an x-ray image of an acceptable bond between a heat spreader and a die showing minor voids in the solder where the voids total less than 5% of the overall area of the die.
Figure 27:
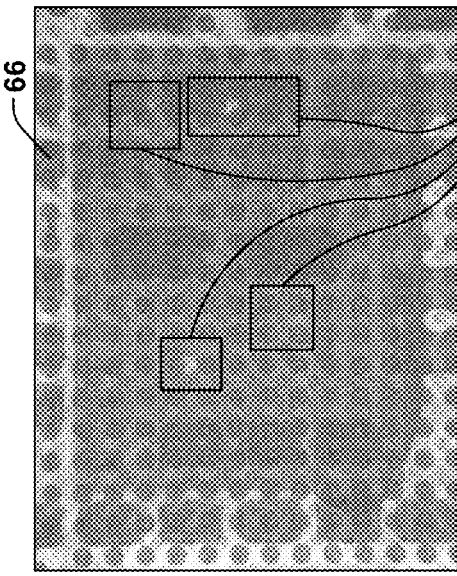
FIG. 27 depicts an x-ray image of a bond between a heat spreader and a die showing spill-over bulging from the die, which could cause shorting and needs to be evaluated further before it can be deemed acceptable.

After the assembly has been heated, the assembly is completed and it is necessary to check for defects. An x-ray may be taken to look for defects. Voids seen in x-ray images 66 that appear to be greater than 5% of the indium soldered die surface area are considered to be defective. Due to the heat spreader 12, printed circuit board 68, back side components (not shown but similar to 10) and processor construction, x-ray inspection is difficult to determine voiding or contact of the indium with the die 14 and heat spreader 12 surfaces. Spillover is acceptable without voiding. Voids are acceptable if the total number of voids covers less than 5% of the die 14 surface area. FIGS. 24-27 depict various x-ray images 66 after reflow. FIGS. 24 and 25 depict acceptable voids 70 and spillover 72. Incomplete die contact that creates a void 74 with no spill over is unacceptable, as shown in FIG. 26. Spill over 76 of indium that could cause shorting requires further evaluation or inspection in order to insure that no shorting occurs, as shown in FIG. 27. When shorting is in question, a microscope may be used to inspect the indium. In addition, a mirror may be necessary to inspect from views where components block viewing. In addition, the heat spreader 12 should be visually inspected to ensure flatness and proper orientation.

A type of reflow oven that may be used is the Heller 1707EXL. Rework of the assembly is generally not possible because the indium solder provides a permanent bond between the die 14 and the heat spreader 12. Removal of the heat spreader 12 will result in a loss of the gold interface of the component die. Thus, the heat spreader 12/BGA package 10 will need to be replaced if unacceptable defects are identified.

The above description involved applying flux to the bonding surfaces present on the die and on the heat dissipating member. Alternatively, flux could be applied to the preform solder component. For example, in one example, flux could be applied to the die and to the upper surface of the preform solder, so that the flux between the die and preform solder component is initially positioned on the die while the flux between the preform solder component and the heat dissipating member gold surface is initially positioned on the upper surface of the preform solder component.

In another example, the flux could be positioned on both sides of the preform solder component and not initially on the die or on the heat dissipating member gold layer. In this example, the flux between the die and the preform solder component would be provided by the lower surface of the preform solder component and the flux between the die and the preform solder component and the heat dissipating member would be provided by the upper surface of the preform solder component.

In yet another example, the flux could initially be positioned on the lower gold surface of the heat dissipating member and on the lower surface of the preform solder component. In this example, the flux between the die and the preform solder component is provided by the lower surface of the preform solder component and the flux between the preform solder component and the heat dissipating member is provided by the flux positioned on the gold surface of the heat dissipating member. These variations provide the user with different options for how and when the flux is applied. Moreover, it may be possible to pre-flux the preform solder component so that it shortens the assembly time, among other benefits. Thus, the above process description is applicable with any of these examples.

While a heat spreader 12 was discussed above, other heat dissipating devices may also or alternatively be utilized, such as heat sinks, heat pipes embedded in heat collectors, and/or any other heat conducting devices. While a given die configuration was disclosed, other shapes and sizes for the die 14, for the BGA package 10, and for the heat spreader 12 may be utilized depending upon the application.

While a lint free swab and wipe are describe in connection with cleaning the various surfaces of the various components and preforms, any type of absorbent media may be used. In addition, cleaning solutions other than alcohol or acetone may also be used.

While the above-description was generally in the context of ball grid array packages, other types of integrated circuit package technologies may also derive a benefit from the invention described herein. These include pin grid arrays, land grid arrays, multiple integrated circuit stack-ups and other types of mounting and packaging technologies. These technologies are collectively included within the term electronic device package 10. In addition, the invention is applicable to a variety of package materials including organic, ceramic, and flex packages.

The term "substantially," if used herein, is a term of estimation.

While various features are presented above, it should be understood that the features may be used singly or in any combination thereof. Further, it should be understood that variations and modifications may occur to those skilled in the art to which the claimed examples pertain. The examples described herein are exemplary. The disclosure may enable those skilled in the art to make and use alternative designs having alternative elements that likewise correspond to the elements recited in the claims. The intended scope may thus include other examples that do not differ or that insubstantially differ from the literal language of the claims. The scope of the disclosure is accordingly defined as set forth in the appended claims.

What is claimed is:

1. A heat spreader comprising:
   a body having a substantially flat upper surface and a substantially flat lower surface;
   gold plating in at least an area on the lower surface of the body that is for aligning with a die and a solder component of an electronic device package, wherein the solder component comprises a solder thermal interface material; and
   standoffs extending from the lower surface of the body and having a height that promotes squeeze-out of the solder thermal interface material when the heat spreader is positioned over the electronic device package, wherein the standoffs comprise support surfaces configured to abut an upper surface of the electronic device package and outer legs configured to extend along and abut an outer edge of the electronic device package.

2. The heat spreader of claim 1, wherein the heat spreader is nickel plated on at least a part of its external surface and has a width and a length that is greater than a width and a length of the electronic device package.

3. The heat spreader of claim 1, further comprising alignment tabs for aligning the heat spreader with outside edges of the electronic device package, wherein the alignment tabs are configured to abut an outer edge of the electronic device package.

4. The heat spreader of claim 1, further comprising etching on the upper surface of the body that coincides with a location of the die when the heat spreader is positioned over the die on the electronic device package.

5. The heat spreader of claim 1, wherein a low surface roughness is provided in the area of the gold plating.

6. The heat spreader of claim 1, further comprising a flux layer positioned between the die and the solder component.

7. The heat spreader of claim 1, further comprising a flux layer positioned between the solder component and the body.

8. The heat spreader of claim 1, further comprising a first flux layer positioned between the die and the solder component and a second flux layer positioned between the solder component and the body.

9. The heat spreader of claim 8, wherein the solder component is a reflowed solder component, reflowed to the die and the first flux layer, and the body and the second flux layer.

10. The heat spreader of claim 8, wherein the solder component is a first reflowed solder component, first reflowed to the die and the first flux layer, and the body and the second flux layer.

11. The heat spreader of claim 1, wherein the solder component is a reflowed solder component, reflowed to the die and the body.

12. The heat spreader of claim 1, wherein the solder component is a first reflowed solder component, first reflowed to the die and the body.

13. An electronic device including the heat spreader of claim 1 and an electronic device package including a die and a solder component, wherein the support surfaces of the standoffs abut an upper surface of the electronic device package and the outer legs of the standoffs extend along and abut an outer edge of the electronic device package.

* * * * *

UNITED STATES PATENT AND TRADEMARK OFFICE
CERTIFICATE OF CORRECTION

PATENT NO. : 8,941,234 B2
APPLICATION NO. : 14/242274
DATED : January 27, 2015
INVENTOR(S) : Ivan Straznicky et al.

It is certified that error appears in the above-identified patent and that said Letters Patent is hereby corrected as shown below:

In the Specification

Column 6, line 32; Please delete "+ -" and add -- +/- --

Signed and Sealed this
Thirtieth Day of June, 2015

Michelle K. Lee
*Director of the United States Patent and Trademark Office*